US006628121B1

(12) United States Patent
Leas et al.

(10) Patent No.: US 6,628,121 B1
(45) Date of Patent: Sep. 30, 2003

(54) TOOLS FOR MEASURING ELECTROMETER DISPENSER RESPONSE

(75) Inventors: Peter J. Leas, Penfield, NY (US); Kenneth P. Friedrich, Honeoye, NY (US); Gerald M. Darby, Brockport, NY (US)

(73) Assignee: Heidelberger Druckmaschinen AG, Heidelberg (DE)

( * ) Notice: Subject to any disclaimer, the term of this patent is extended or adjusted under 35 U.S.C. 154(b) by 333 days.

(21) Appl. No.: 09/687,501

(22) Filed: Oct. 13, 2000

(51) Int. Cl.[7] .................................................. G01R 29/12
(52) U.S. Cl. ............................ 324/457; 324/458; 399/9
(58) Field of Search .......................... 324/74, 130, 601, 324/158.1, 457, 458; 399/9, 73, 411, 48

(56) References Cited

U.S. PATENT DOCUMENTS

| | | | | |
|---|---|---|---|---|
| 3,886,329 A | | 5/1975 | Kamiyama | 235/92 |
| 4,205,267 A | * | 5/1980 | Williams | 324/458 |
| 4,211,483 A | | 7/1980 | Hannigan et al. | 355/14 |
| 4,521,102 A | | 6/1985 | Motomura et al. | 355/14 |
| 4,568,172 A | | 2/1986 | Acquaviva | 355/14 |
| 4,607,572 A | | 8/1986 | Pou et al. | 101/426 |
| 4,624,452 A | | 11/1986 | Pulskamp | 270/95 |
| 4,626,156 A | | 12/1986 | Baughman | 412/33 |
| 4,739,865 A | | 4/1988 | Yater et al. | 192/18 |
| 4,774,544 A | | 9/1988 | Tsuchiya et al. | 355/14 |
| 4,782,363 A | | 11/1988 | Britt et al. | 355/14 |
| 5,044,625 A | | 9/1991 | Reid | 271/293 |
| 5,081,595 A | | 1/1992 | Moreno et al. | 395/111 |
| 5,133,048 A | | 7/1992 | Parsons et al. | 395/111 |
| 5,162,850 A | * | 11/1992 | Nakashima | 355/208 |
| 5,212,451 A | * | 5/1993 | Werner, Jr. | 324/458 |
| 5,581,221 A | * | 12/1996 | Kawai et al. | 355/246 |
| 5,596,389 A | | 1/1997 | Dumas et al. | 399/16 |
| 5,699,494 A | | 12/1997 | Colbert et al. | 395/114 |
| 5,715,381 A | | 2/1998 | Hamilton | 395/114 |
| 5,839,022 A | * | 11/1998 | Wang et al. | 399/62 |
| 5,946,461 A | | 8/1999 | Landry et al. | 395/117 |
| 5,956,544 A | * | 9/1999 | Stern et al. | 399/73 |
| 6,026,258 A | | 2/2000 | Fresk et al. | 399/87 |
| 6,051,967 A | * | 4/2000 | Draaijer | 324/72 |
| 6,107,804 A | * | 8/2000 | Suzuki et al. | 324/457 |
| 6,134,568 A | | 10/2000 | Tonkin | 707/526 |
| 6,233,413 B1 | * | 5/2001 | Folkins | 399/71 |
| 6,404,997 B1 | * | 6/2002 | Grace | 399/27 |

FOREIGN PATENT DOCUMENTS

EP 0 479 494 B1 2/1997

OTHER PUBLICATIONS

Manual, "Adobe® Portable Document Formal Reference Manual, Version 1.3," pp. 2–518. Mar. 11, 1999.
Brochure, "Quite Imposing Plus Online Guide 1.2." No date.
Brochure, "W3C Extensible Markup Language (XML) 1.0," W3C Recommendation Feb. 10, 1998, pp. 1–32.
"Adobe® Acrobat 4.0 Guide," pp. 1–595,1999.
Brochure, "StampPDF™ Users Guide—An Acrobat Plug-in," pp. i–lxxxviii, ©1999 Digital Applications, Inc.
Brochure, "TIFF™ Revision 6.0 Specification", pp. 1–121, Jun. 3, 1992.

(List continued on next page.)

*Primary Examiner*—N. Le
*Assistant Examiner*—T. R. Sundaram

(57) ABSTRACT

An apparatus is provided for determining the response of an electrometer used in an electrophotographic recording apparatus. The apparatus includes a movable base disposed adjacent said electrometer. The base includes a non-conductive material. A conductive pattern is disposed on the base. The conductive pattern is electrically connected to a variable power supply. A motor moves or drives the base past the electrometer. The motor is controlled by a motor control to vary the speed of movement of said base. A method is also provided for determining the response of an electrometer used in an electrophotographic recording apparatus. An electrometer to be tested is selected and the operational parameters of the electrometer are dynamically tested.

11 Claims, 2 Drawing Sheets

OTHER PUBLICATIONS

Manual, "TWAIN Specification Version 1.8," pp. I–B–516. Oct. 22, 1998.

Manual, "Open Document Management API, Version 2.0," pp. 1–87, Sep. 19, 1997.

Brochure Guide, "Network Imaging System Interface Development Guide, Release 2," pp. i–I–6, Feb. 2000.

Dan Phelps and John Thompson, "Rendering For Electronic Printers and Copiers," pp. 1–72, Sep. 29, 1992.

Kodak Publication No. FN9074 5/85—"Fundamentals of Digital Copiers—Revision 1," pp. 1–49, May 1985.

* cited by examiner

TOOLS FOR MEASURING ELECTROMETER DISPENSER RESPONSE

BACKGROUND OF THE INVENTION

The efficiency of electrophotographic type copiers or printers depends upon the proper relative charge being maintained between a photoconductive imaging member and a developing mechanism. This charge relationship is used to attract toner or other development material from a supply to the photoconductive member in conformance with both the outline and density of the electrostatic image on the photoconductive member. The electrostatic image that undergoes this development is formed by exposing the previously charged photoconductive member to a light image of the original being copied or to exposure by an electro-optical exposure source.

One method of sustaining the proper charge relationship between the photoconductive member and the developing mechanism is to use an electrostatic voltmeter, commonly called an electrometer, to sense potentials on the photoconductive member at some appropriate point. The electrometer's primary function is to ensure that the desired film voltage is indeed the actual film voltage on the film. To ensure that the photoconductor is charged to the desired film voltage (calculated and set by a densitometer), the electrometer monitors the running average of the actual film voltage. If the film voltage is different from the desired film voltage, the electrometer corrects the grid setting for the primary charger accordingly. The electrometer also monitors the running average of the charging efficiency. The electrometer can be used as a service instrument to provide a visible indication of the photoreceptor charge condition from which the electrostatic development field can be adjusted. In other cases, a feedback loop may be provided as part of process control to enable readings from the electrometer to be used to automatically control the development field.

In these machines, adjustment of one or more of the various operating parameters, such as the primary charge potential level, normally requires that the bias be identified, and changes made therein monitored. Failing to monitor and adjust the bias may result in control of image quality because the proper amount of toner is not used.

In such systems, the charge relationship must be controlled in a dynamic manner. That is, the electrometer must be able to respond within a specified window, in which the voltage measurement is made.

Presently, the current response time of an electrometer is only measured in a static mode. Typically, a one kilovolt signal is applied to a stationary plate and the corresponding electrometer signal is measured using an oscilloscope. Thus, electrometer response currently is measured and specified in a static mode. However, actual use of an electrometer in an electrophotographic system is in a dynamic mode. That is, the electrometer must respond to quickly changing operational parameters, such as a moving photoconductive belt. There is a difference in electrometer response when comparing static versus dynamic and thus static testing may not be sufficient to assure the performance of an electrometer.

It is therefore an object of the present invention to provide a new and improved apparatus and method for determining the response of electrometers used in electrophotographic reproduction machines.

The invention and its various advantages will become more apparent to those skilled in the art from the ensuing detailed description of preferred embodiments, reference being made to the accompanying drawings.

BRIEF SUMMARY OF THE INVENTION

An apparatus is provided for determining the response of an electrometer used in an electrophotographic recording apparatus. The apparatus includes a movable base disposed adjacent said electrometer. The base includes a non-conductive material. A conductive pattern is disposed on the base. The conductive pattern is electrically connected to a variable power supply. A motor moves or drives the base past the electrometer. The motor is controlled by a motor control to vary the speed of movement of said base.

The present invention also contemplates a method for determining the response of an electrometer used in an electrophotographic recording apparatus. An electrometer to be tested is selected and the operational parameters of the electrometer are dynamically tested. In a preferred embodiment, the dynamically testing is accomplished by providing a movable test pattern adjacent the electrometer, supplying a voltage to the test pattern, and moving said test pattern relative to the electrometer.

BRIEF DESCRIPTION OF THE DRAWINGS

The following description of the preferred embodiments of the present invention refers to the attached drawings, wherein.

DETAILED DESCRIPTION OF THE PRESENTLY PREFERRED EMBODIMENTS

Apparatus of the general type described herein are well known in the art. Therefore, the present description will be directed in particular to elements forming part of, or cooperating more directly with, the present invention. While the invention will be described with reference to an electrophotographic system the invention can also be used in other electrographic systems.

Figure 1:
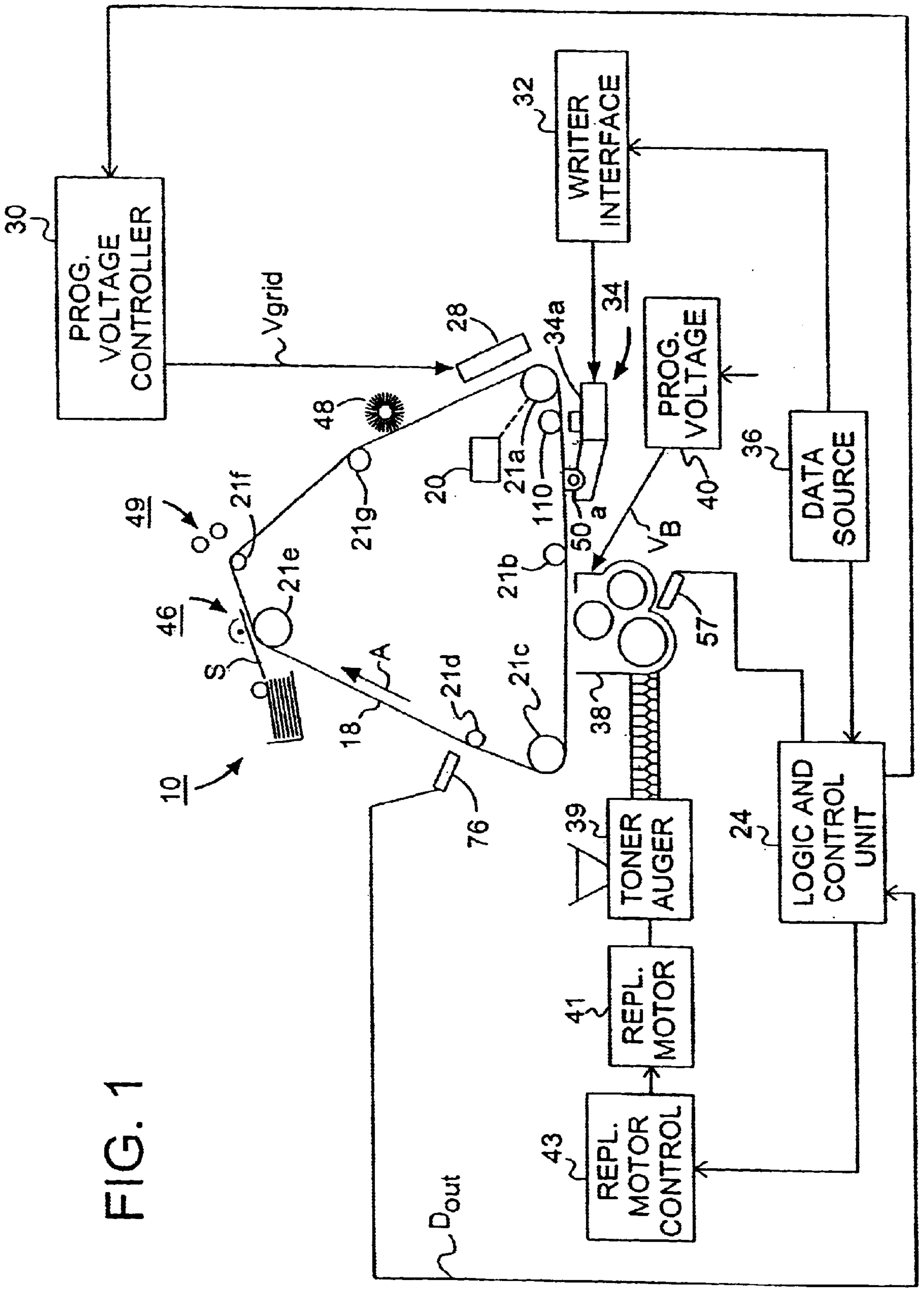
FIG. 1 is a schematic showing a side elevational view in schematic form of an electrostatographic machine that is used in accordance with a preferred embodiment of the invention.

With reference to the electrophotographic copier and/or printer machine 10 as shown in FIG. 1, a moving recording member such as photoconductive belt 18 is entrained about a plurality of rollers or other supports 21*a–g* one or more of which are driven by a motor 20 so as to advance the belt in a direction indicated by an arrow A past a series of work stations of the copier/printer machine. A photoconductive drum may be used instead of a belt. A logic and control unit (LCU) 24, which has a digital computer, has a stored program for sequentially actuating the work stations in response to signals from various sensors and encoders as is well known.

Briefly, a primary charging station 28 sensitizes belt 18 by applying a uniform electrostatic charge of predetermined primary voltage $V_o$ to the surface of the belt. The output of the charging station is regulated by a programmable voltage controller 30, which is in turn controlled by LCU 24 to adjust primary voltage $V_o$ for example through control of electrical potential (Vgrid) to a grid that controls movement of corona charges from charging wires to the surface of the recording member as is well known. Other known forms of chargers, including roller chargers, may also be used.

At an exposure station 34, projected light from a write head 34*a* dissipates the electrostatic charge on the photoconductive belt to form a latent image of a document to be copied or printed. The write head preferably has an array of light-emitting diodes (LEDs) or other light source such as a laser or other spatial light modulator for exposing the photoconductive belt picture element (pixel) by picture element with a regulated intensity and exposure, Eo. Alternatively, the exposure may be by optical projection of an image of a document or a patch onto the photoconductor.

Where an LED or other electro-optical exposure source or writer is used, image data for recording is provided by a data source 36 for generating electrical image signals. The data source 36 may be a computer, a document scanner, a memory, a data network, etc. Signals from the data source and/or LCU may also provide control signals to a writer interface 32 for identifying exposure correction parameters in, for example, a look-up table (LUT) for use in controlling image density. Travel of belt 18 brings the areas bearing the latent charge images into a development station 38. The development station has one (more if color) magnetic brushes in juxtaposition to, but spaced from, the travel path of the belt. Magnetic brush development stations are well known.

An electrometer probe 50*a* which is mounted at a location preferably downstream of the corona charging station 28 relative to the direction of the movement of the belt 18 which direction is indicated by the arrow A. In the example illustrated in FIG. 1 the electrometer probe 50*a* is mounted immediately downstream of the writehead 34*a*. Further details of this exemplary system are provided in U.S. Pat. No. 5,956,544, which is incorporated herein by reference.

Figure 2:
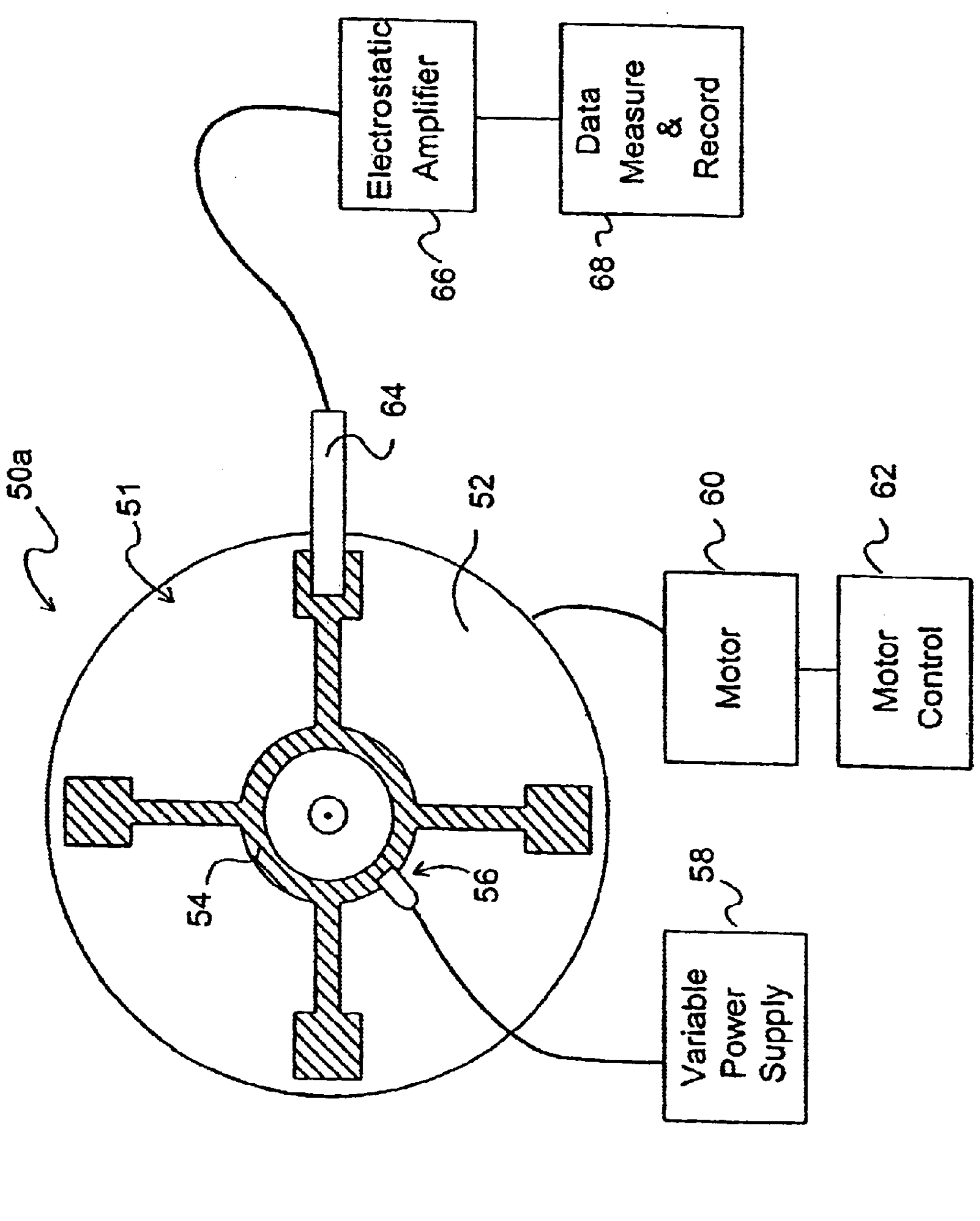
FIG. 2 is a top view of a preferred embodiment of the test platter used in the present invention.

Referring now to FIG. 2, a preferred embodiment of a device for testing the response of an electrometer is illustrated. The device comprises a moveable base, illustrated as a disk or platter 51, which includes a non-conductive section 52. A conductive test pattern 54 is formed on or adhered to the non-conductive section 52. The test pattern 54 can be formed on or adhered to the non-conductive section 52 by an adhesive or any other suitable method. In an exemplary embodiment, the platter 51 has a nine inch diameter. The non-conductive section may be any suitable non-conductive material, such as polycarbonate. The conductive pattern 54 may be comprised of any suitable conductive material, such as aluminum.

A variable power supply 58 is connected through a contact brush 56 to the test pattern 54. The top of the platter 52 is grounded.

An electrometer assembly comprised of a probe or sensor 64 and an electrostatic voltmeter/amplifier 66. The electrometer is connected to a meter and/or recording device 68 which provides means to measure and record data from the electrometer assembly. The platter 51 is disposed adjacent the sensor 64.

A motor 60 rotatably drives the platter 51. A motor control unit 62 is provided to control the speed of the motor 60. In the illustrated embodiment, the motor 60 is a variable speed motor, such as an E-552-M motor available from Electrocraft. The motor control unit 62 may be any suitable motor control unit to control variable speed motors known in the art. The motor control unit 62 controls the motor to drive the platter at varying speeds to determine the response of the electrometer 64, 66. For example the motor may be controlled to spin between 50–300 rpm for a nine inch diameter platter 51.

Although in FIG. 2 the test pattern 54 is illustrated as being in a generally cross shape, other suitable patterns may be used. For example, the platter 51 may be divided one-half as ground and one-half as the conductive material such that one-half of the platter is at the desired voltage. The test pattern may also be comprised of pie-shaped wedges which may be, for example, 0.5 inches, 0.75 inches or 1.0 inch at their outermost perimeter. The outer edge of the test pattern may also be adjusted depending on the particular use contemplated. For example, the outer edge of the test pattern may be disposed one-third of the distance from the hub of the platter 51 for a nine inch diameter platter.

In order to measure the dynamic response of the electrometer, the target patch is intended to simulate actual use conditions. The target patch or pattern is passed under the electrometer probe 64, mounted an appropriate distance from the probe 64. The patch size, speed of the platter 51 and the probe position along an axis which runs through the center of the disk are controlled in order to determine the full dynamic range of the electrometer.

The variable power supply 58 is also used to vary the voltage supplied to the test pattern 54. The magnitude of the patch voltage and the time spent in transition determine the electrometer's response. Measurements can be made and saved by using any suitable storage device, such as a storage oscilloscope or a PC-based measurement system. By varying the speed of the platter 51 and/or the target size, it is possible to test for a large range of conditions.

It will be recognized by those skilled in the art that the disclosed apparatus can also be used for testing in the static mode.

It is therefore intended that the foregoing detailed description be regarded as illustrative rather than limiting, and that it be understood that it is the following claims, including all equivalents, that are intended to define the spirit and scope of this invention.

What is claimed is:

1. An apparatus for determining the response of an electrometer used in an electrophotographic recording apparatus comprising:

- a movable base disposed adjacent said electrometer, said base including of a non-conductive material;
- a conductive pattern disposed on said base, said conductive pattern electrically connected to a variable power supply;
- a motor to drive said base; and
- a motor control to vary the speed of movement of said base.

2. The apparatus of claim 1 wherein the base comprises a platter that is rotatably driven by said motor about an axis and wherein the motor control varies the speed of rotation of said platter.

3. The apparatus of claim 1 further comprising a data recording device connected to said electrometer.

4. A method for determining the response of an electrometer used in an electrophotographic recording apparatus comprising:

- selecting an electrometer to be tested; and
- dynamically testing at least one operational parameter of said electrometer, wherein said step of dynamically testing comprises:
  - providing a movable test pattern adjacent said electrometer;
  - supplying a voltage to said test pattern; and
  - moving said test pattern relative to said electrometer.

5. The method of claim 4 wherein said dynamic testing of said at least one operational parameter comprises dynamically testing a current response of said electrometer.

6. The method of claim 4 wherein said test pattern is mounted on a rotatable platter and wherein said step for moving said test pattern comprises rotating said platter.

7. The method of claim 4 wherein the step of dynamically testing comprises varying the voltage supplied by said variable power supply to said test pattern.

8. The method of claim 4 wherein the step of dynamically testing comprises varying the speed of movement of said movable test pattern.

9. The method of claim 4 further comprising the step of varying the size of said test pattern move past said electrometer.

10. An apparatus for determining the response of an electrometer used in an electrophotographic recording apparatus comprising:

a rotatable platter disposed adjacent said electrometer, said platter including of a non-conductive material;

a conductive pattern disposed on said platter, said conductive pattern electrically connected to a variable power supply;

a motor to rotate said platter; and a motor control to vary the speed of rotation of said platter.

11. The apparatus of claim 10 wherein the motor control varies the speed of rotation of said platter.

* * * * *